(12) United States Patent
Hikichi et al.

(10) Patent No.: US 9,453,888 B2
(45) Date of Patent: Sep. 27, 2016

(54) SENSOR DEVICE

(71) Applicant: Seiko Instruments Inc., Chiba-shi, Chiba (JP)

(72) Inventors: Tomoki Hikichi, Chiba (JP); Minoru Ariyama, Chiba (JP); Kentaro Fukai, Chiba (JP); Takemasa Miura, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 56 days.

(21) Appl. No.: 14/664,320

(22) Filed: Mar. 20, 2015

(65) Prior Publication Data

US 2015/0276891 A1   Oct. 1, 2015

(30) Foreign Application Priority Data

Mar. 25, 2014   (JP) .................. 2014-061698

(51) Int. Cl.
| | |
|---|---|
| *G01R 33/00* | (2006.01) |
| *G01R 33/02* | (2006.01) |
| *G01R 33/06* | (2006.01) |
| *G01R 33/07* | (2006.01) |
| *G01R 1/30* | (2006.01) |

(52) U.S. Cl.
CPC .......... *G01R 33/0023* (2013.01); *G01R 33/07* (2013.01)

(58) Field of Classification Search
CPC ...... G01R 33/00; G01R 33/02; G01R 33/06; G01R 33/07; G01R 1/30
USPC .......... 324/225, 244, 251–252, 117 R, 123 R
See application file for complete search history.

(56) References Cited

U.S. PATENT DOCUMENTS

2013/0076350 A1   3/2013   Muraoka et al.

*Primary Examiner* — Tung X Nguyen
*Assistant Examiner* — Neel Shah
(74) *Attorney, Agent, or Firm* — Brinks Gilson & Lione

(57) ABSTRACT

The sensor device includes: a physical quantity voltage conversion element; a differential amplifier; a first capacitor that includes one terminal connected to a first output terminal of the differential amplifier; a comparator; a low pass filter circuit arranged at the first output terminal of the differential amplifier; a control circuit configured to on/off control the physical quantity voltage conversion element, the differential amplifier, the comparator, and the low pass filter circuit; and a logic circuit configured to output a result of operation processing performed on an output signal of the comparator. The logic circuit is configured to: successively verify, in a case where there is a change between a previous logic output and a first logic output, the logic outputs a plurality of times; and output a control signal to the control circuit so that the low pass filter circuit is turned on in a second signal processing period and thereafter.

4 Claims, 9 Drawing Sheets

SENSOR DEVICE

RELATED APPLICATIONS

This application claims priority under 35 U.S.C. §119 to Japanese Patent Application No. 2014-061698 filed on Mar. 25, 2014, the entire contents of which is hereby incorporated by reference.

BACKGROUND OF THE INVENTION

1. Field of the Invention

The present invention relates to a sensor device configured to convert a physical quantity (for example, magnetic field intensity) into an electric signal, and more particularly, to a magnetic sensor device to be used for, for example, an open/close state detection sensor for a flip cell phone or a notebook computer, or a rotation number/rotation position detection sensor for a motor.

2. Description of the Related Art

A magnetic sensor device has been used for an open/close state detection sensor for a flip cell phone or a notebook computer, or a rotation number/rotation position detection sensor for a motor.

The magnetic sensor device outputs a voltage proportional to magnetic field intensity or magnetic flux density by a magnetoelectric conversion element (for example, Hall element), amplifies the output voltage by an amplifier, and determines the amplified voltage by a comparator, thereby outputting the determined voltage as a binary value of an H signal or an L signal. Because the output voltage of the magnetoelectric conversion element is minute, an offset voltage of the magnetoelectric conversion element (element offset voltage), an offset voltage of the amplifier or the comparator (input offset voltage), or noise generated in the magnetic sensor device causes a problem. The element offset voltage is generated mainly by stress on the magnetoelectric conversion element received from a package. The input offset voltage is generated mainly by characteristic fluctuations in elements forming an input circuit of the amplifier. The noise is generated mainly by flicker noise of a single transistor forming the circuit or thermal noise of a single transistor or a resistive element.

In order to reduce the fluctuations in magnetic detection/release operation, which occur due to the above-mentioned noise of the magnetoelectric conversion element and the amplifier, without significantly increasing power consumption, a magnetic sensor device illustrated in FIG. 10 has been proposed (for example, see Japanese Patent Application Laid-open No. 2013-74415).

The related-art magnetic sensor device includes a Hall element 1 being the magnetoelectric conversion element, a switching circuit 2, a differential amplifier 3, a comparator 4, a control circuit 5, D type flip-flops D1, D2, and D3, XOR circuits X1 and X2, selector circuits SL1 and SL2, an AND circuit AN1, an OR circuit OR1, a capacitor C1, a switch S1, an output terminal VOUT, and terminals E1 and E2. The logic circuit successively verifies logic outputs a plurality of times only in a case where the logic outputs are changed due to change in magnetic field intensity.

However, the related-art magnetic sensor device always makes magnetic determination, which requires a constant signal processing period and thus has high accuracy, even when a mobile device is normally used (for example, a flip cell phone is in a fully opened state or a fully closed state) and an applied magnetic field hardly changes. Consequently, an effect of reducing average current consumption is limited.

SUMMARY OF THE INVENTION

In order to solve the related-art problem as described above, a sensor device according to one embodiment of the present invention has the following configuration.

The sensor device includes: a physical quantity voltage conversion element configured to output a differential voltage in accordance with a magnitude of a physical quantity; a differential amplifier configured to amplify an output signal of the physical quantity voltage conversion element; a first capacitor that includes one terminal connected to a first output terminal of the differential amplifier, and is configured to store an offset voltage; a comparator configured to input a signal obtained by amplifying the output signal of the physical quantity voltage conversion element, and to output a result of comparison; a low pass filter circuit arranged at the first output terminal of the differential amplifier; a control circuit configured to on/off control the physical quantity voltage conversion element, the differential amplifier, the comparator, and the low pass filter circuit; and a logic circuit configured to output a result of operation processing performed on an output signal of the comparator as a logic output, the logic circuit being configured to: successively verify, in a case where there is a change between a previous logic output and a first logic output, the logic outputs a plurality of times; and output a control signal to the control circuit so that the low pass filter circuit is turned on in a second signal processing period and thereafter.

According to the sensor device of the one embodiment of the present invention, it is possible to reduce fluctuations in determination on detection of the physical quantity (magnetic field intensity) or release of the detection, which occur due to noise generated by the components in the device and noise from the outside, and to reduce power consumption more than the related art. Moreover, the sensor device, which enables the highly accurate detection of the physical quantity (magnetic field intensity) or the release with low current consumption, can be provided.

DETAILED DESCRIPTION OF THE PREFERRED EMBODIMENTS

A sensor device of the present invention is now described in detail with reference to the drawings. In the following, a magnetic sensor device using a magnetoelectric conversion element is described. However, it can be expected that the sensor device of the present invention has the same effect using a conversion element configured to output a voltage in accordance with acceleration and pressure instead of the magnetoelectric conversion element.

First Embodiment

Figure 1:
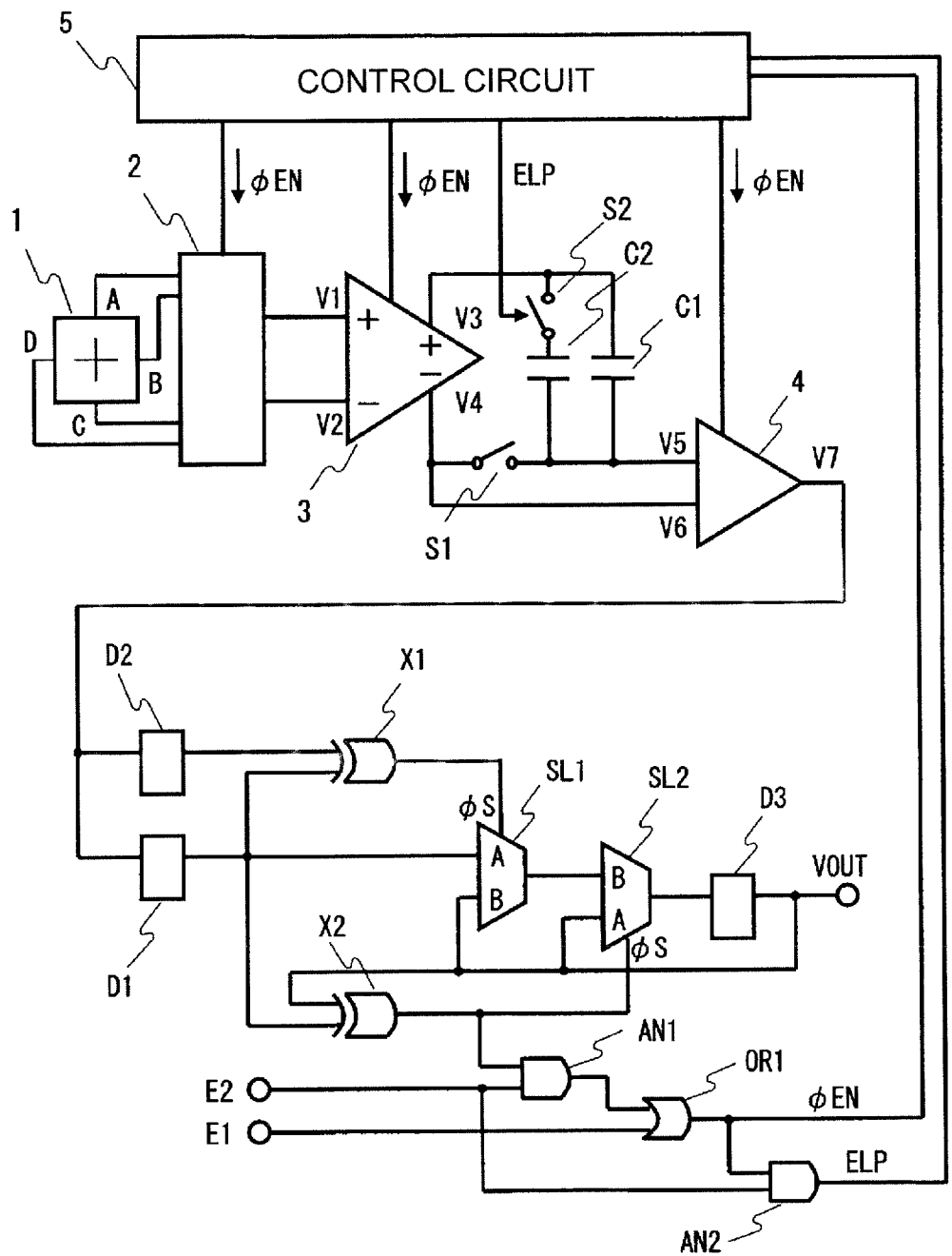
FIG. 1 is a circuit diagram illustrating a magnetic sensor device according to a first embodiment of the present invention.

FIG. 1 is a circuit diagram illustrating a magnetic sensor device according to a first embodiment of the present invention. The magnetic sensor device of the first embodiment includes a Hall element 1 being the magnetoelectric conversion element, a switching circuit 2, a differential amplifier 3, a comparator 4, a control circuit 5, D type flip-flops D1, D2, and D3, XOR circuits X1 and X2, selector circuits SL1 and SL2, an AND circuit AN1, an OR circuit OR1, a capacitor C1 being an offset voltage storage capacitor, a capacitor C2 being an offset voltage storage and low pass filter capacitor, a switch S1, a switch S2, an output terminal VOUT, a terminal E1 for inputting an ON/OFF signal $\phi$E1, and a terminal E2 for inputting an ON/OFF signal $\phi$E2. The Hall element 1 has a first terminal pair A-C and a second terminal pair B-D. The switching circuit 2 has four input terminals respectively connected to the terminals A, B, C, and D of the Hall element 1, a first output terminal, and a second output terminal. The differential amplifier 3 has a first input terminal, a second input terminal, a first output terminal, and a second output terminal. The selector circuits SL1 and SL2 each include an input terminal A, an input terminal B, a select terminal $\phi$S, and an output terminal.

The differential amplifier 3 has the first output terminal connected to one ends of the capacitor C1 and the switch S2, and the second output terminal connected to one end of the switch S1. The other end of the switch S2 is connected to one end of the capacitor C2. The comparator 4 has a first input terminal connected to the other end of the capacitor C1, the other end of the capacitor C2, and the other end of the switch S1, a second input terminal connected to the second output terminal of the differential amplifier 3, and an output terminal connected to input terminals of the D type flip-flops D1 and the D type flip-flop D2. The XOR circuit X1 has a first input terminal connected to an output terminal of the D type flip-flop D1, a second input terminal connected to an output terminal of the D type flip-flop D2, and an output terminal connected to the select terminal $\phi$S of the selector circuit SL1. The XOR circuit X2 has a first input terminal connected to the output terminal of the D type flip-flop D1 and the input terminal A of the selector circuit SL1, a second input terminal connected to the input terminal B of the selector circuit SL1, the input terminal A of the selector circuit SL2, an output terminal of the D type flip-flop D3, and the output terminal VOUT, and an output terminal connected to the select terminal $\phi$S of the selector circuit SL2 and a first input terminal of the AND circuit AN1. The selector circuit SL2 has the input terminal B connected to the output terminal of the selector circuit SL1, and the output terminal connected to an input terminal of the D type flip-flop D3. The AND circuit AN1 has a second input terminal connected to the terminal E2, and an output terminal connected to a first input terminal of the OR circuit OR1. The OR circuit OR1 has a second input terminal connected to the terminal E1, and an output terminal connected to the control circuit 5. The AND circuit AN2 has a first input terminal connected to the output terminal of the OR circuit OR1, a second input terminal connected to the terminal E2, and an output terminal connected to the control circuit 5. The control circuit 5 inputs a $\phi$EN signal from the OR circuit OR1 and outputs the $\phi$EN signal to the switching circuit 2, the differential amplifier 3, and the comparator 4. Moreover, the control circuit 5 inputs an ELP signal from the AND circuit AN2 and outputs the ELP signal to the switch 2.

Figure 5:
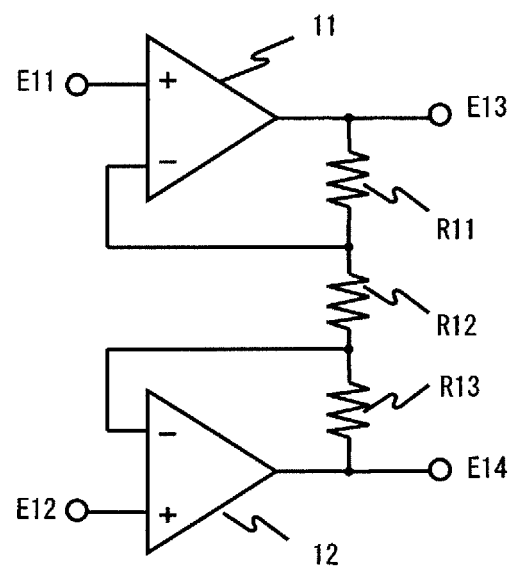
FIG. 5 is a circuit diagram illustrating an example of a differential amplifier used in the first embodiment.

FIG. 5 is a circuit diagram illustrating an example of the differential amplifier 3 used in the first embodiment. The differential amplifier 3 is configured as an instrumentation amplifier in general. The differential amplifier 3 includes differential amplifiers 11 and 12, and feedback resistors R11, R12, and R13. Connections in the differential amplifier 3 are described. Specifically, the differential amplifier 11 has a non-inverted input terminal connected to the first input terminal, an inverted input terminal connected to a node between one terminal of the feedback resistor R11 and one terminal of the feedback resistor R12, and an output terminal connected to the first output terminal and the other terminal of the feedback resistor R11. The differential amplifier 12 has a non-inverted input terminal connected to the second input terminal, an inverted input terminal connected to a node between one terminal of the feedback resistor R13 and the other terminal of the feedback resistor R12, and an output terminal connected to the second output terminal and the other terminal of the feedback resistor R13. The differential amplifier 3 is configured as the instrumentation amplifier described above, and hence the influence of in-phase noise on a differential input can be suppressed.

The switching circuit 2 has a function of switching a first detection state in which the first terminal pair A-C of the Hall element 1 inputs a power supply voltage and the second terminal pair B-D outputs a detection voltage, and a second detection state in which the second terminal pair B-D inputs the power supply voltage and the first terminal pair A-C outputs the detection voltage.

Figure 2:
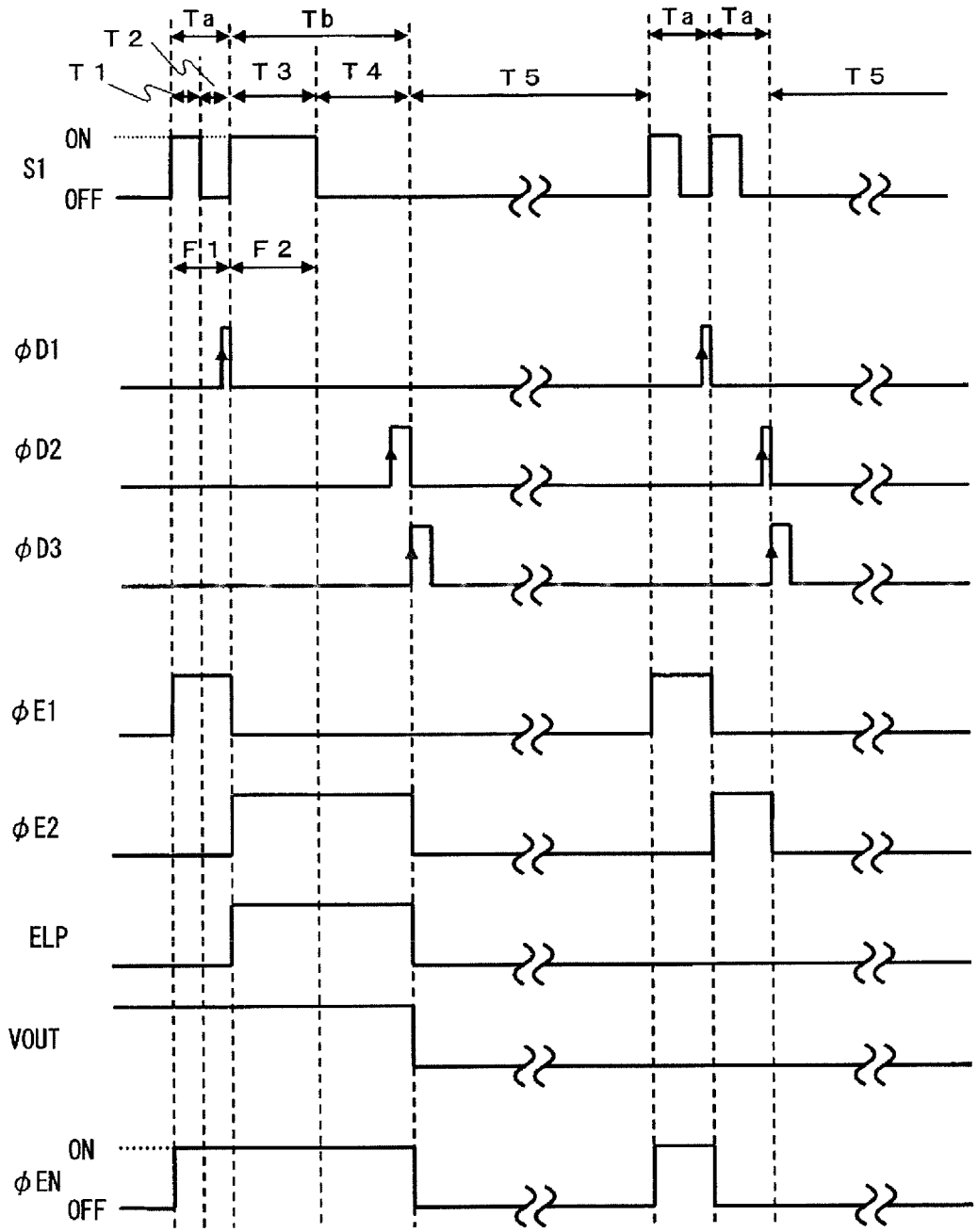
FIG. 2 is a timing chart of the magnetic sensor device of the present invention.

Next, operation of the magnetic sensor device of this embodiment is described. FIG. 2 is a timing chart of the magnetic sensor device of this embodiment.

One period T of the detection operation of the magnetic sensor device is divided into a first detection state T1 and a second detection state T2 by the operation of the switching circuit 2. Moreover, the one period T is divided into a sampling phase F1 and a comparing phase F2 by whether the switch S1 opens or closes. In the sampling phase F1, the Hall element 1 and an offset component of the differential amplifier 3 are stored in the capacitor C1. In the comparing phase F2, a voltage determined based on magnetic field intensity and a detection voltage level are compared with each other. "H" is input as the ON/OFF signal $\phi$E1 during a first detection operation period T. "H" is input as the ON/OFF signal $\phi$E2 during a second detection operation period T.

In this case, $\phi$Dm represents a clock signal for latching, which is input to an m-th D type flip-flop Dm. Moreover, unless otherwise specified, the D type flip-flop latches input data at a time when the clock signal rises. Moreover, a differential output voltage of the magnetoelectric conversion element 1 is represented by Vh, output voltages of the switching circuit 2 are represented by V1 and V2, output voltages of the differential amplifier 3 are represented by V3 and V4, a gain of the differential amplifier 3 is represented by G, an input offset voltage of the differential amplifier 3 is represented by Voa, input voltages of the comparator 4 are represented by V5 and V6, and an output voltage of the comparator 4 is represented by V7.

In the sampling phase F1, the Hall element 1 is in the first detection state T1 and the switch S1 is turned on. Because the switch Si is turned on, $$Vc1=(V3-V4)=G(Vh1+Voa) \quad (1)$$

is charged to the offset voltage storage capacitor C1. Subsequently, in the comparing phase F2 (second detection state T2), the switch S1 is turned off so that $$Vc2=(V3-V4)=G(-Vh2+Voa) \quad (2)$$

is output. In this case, $$V5-V6=V3-Vc1-V4=Vc2-Vc1=-G(Vh1+Vh2) \quad (3)$$

holds, and the influence of the input offset voltage is balanced out. Moreover, because the detection voltages Vh1 and Vh2 of the magnetoelectric conversion element generally have effective signal components in in-phase and element offset components in anti-phase, the influence of an element offset component is also removed from the above-mentioned output voltage.

Then, in the comparing phase F2, a detection voltage component of the applied magnetic field intensity expressed by Expression (3) is compared with a reference voltage in the comparator 4, and the signal V7 (H signal (VDD) or L signal (GND)) is output.

In this case, the reference voltage in this embodiment corresponds to an in-phase voltage at the Hall element 1. Moreover, the reference voltage can be arbitrarily set by adding a circuit.

The signal V7 output from the comparator 4 is input to a logic circuit described in detail below. The signal V7 output from the comparator 4 is latched twice at different timings by the two D type flip-flops D1 and D2. The second latching is performed during successive re-detection operation, that is, after one detection period T has passed after the first latching. Then, the XOR circuit X1, to which those two output terminals are connected, inputs the output signal of the comparator 4 to the selector circuit SL2 through the selector circuit SL1 only when those two output values are the same. On the contrary, when the values of the two outputs of the D type flip-flops D1 and D2 are different from each other, an output result of previous detection, which has been stored in the D type flip-flop D3, is input to the selector circuit SL2 as it is. In other words, the detection or the release is not determined unless the same detection (release) state continues for the time period T, and hence it is possible to prevent false detection and false release occurring due to the influence of instantaneous noise.

Subsequently, only when two output values of the output result of the previous detection stored in the D type flip-flop D3 and the output terminal of the D type flip-flop D1, which is connected to the XOR circuit X2, are different from each other, the XOR circuit X2 inputs the output signal of the selector circuit SL1 to the D type flip-flop D3 through the selector circuit SL2. The signal is ultimately latched at a timing φD3. On the contrary, when the two output values input to the XOR circuit X2 are the same, the output result of the previous detection stored in the D type flip-flop D3 is input to the D type flip-flop D3 as it is to be latched.

Moreover, the output of the XOR circuit X2 and the ON/OFF signal φE2 are input to the AND circuit AN1, and the ON/OFF signal φE2 is input to the OR circuit OR1 through the AND circuit AN1 only in a case where the two output values input to the XOR circuit X2 are different from each other. Then, the ON/OFF signal φE1 and the ON/OFF signal φE2 are combined in the OR circuit OR1, and the resultant signal is output as the φEN signal. On the other hand, in a case where the two output values input to the XOR circuit X2 are the same, the output of the AND circuit AN1 is fixed to the L signal. Consequently, the ON/OFF signal φE1 is output from the OR circuit OR1 as it is as the φEN signal. Moreover, because the AND circuit AN2 inputs the φEN signal and the ON/OFF signal φE2, the AND circuit AN2 outputs the ELP signal having "H" only in a case where the second determination is made.

In other words, the second determination is made when the first latch result and the previous detection result are different from each other, and the first and second results are checked, thereby determining the detection result. In this case, power required for the total of the first and second signal processing periods (Ta+Tb) is consumed. On the contrary, when the first latch result and the previous detection result are the same, the second determination is not made, and a current supply to a circuit configured to perform signal processing for the differential amplifier 3 and the like is interrupted. In this case, the power consumption for the second signal processing period Tb can be reduced. Note that, even in the case where the first latch result and the previous detection result are different from each other, the first determination is invalid if the first latch result and the second latch result are different from each other. Consequently, the detection result VOUT does not change but the power required for the total of the first and second signal processing periods (Ta+Tb) is consumed.

Through the operation described above, it is possible to suppress fluctuations in determination result of the detection of the magnetic field intensity or the release, which occur due to noise generated in the sensor device or noise from the outside, and to suppress the power consumption to the minimum necessary.

Figure 8:
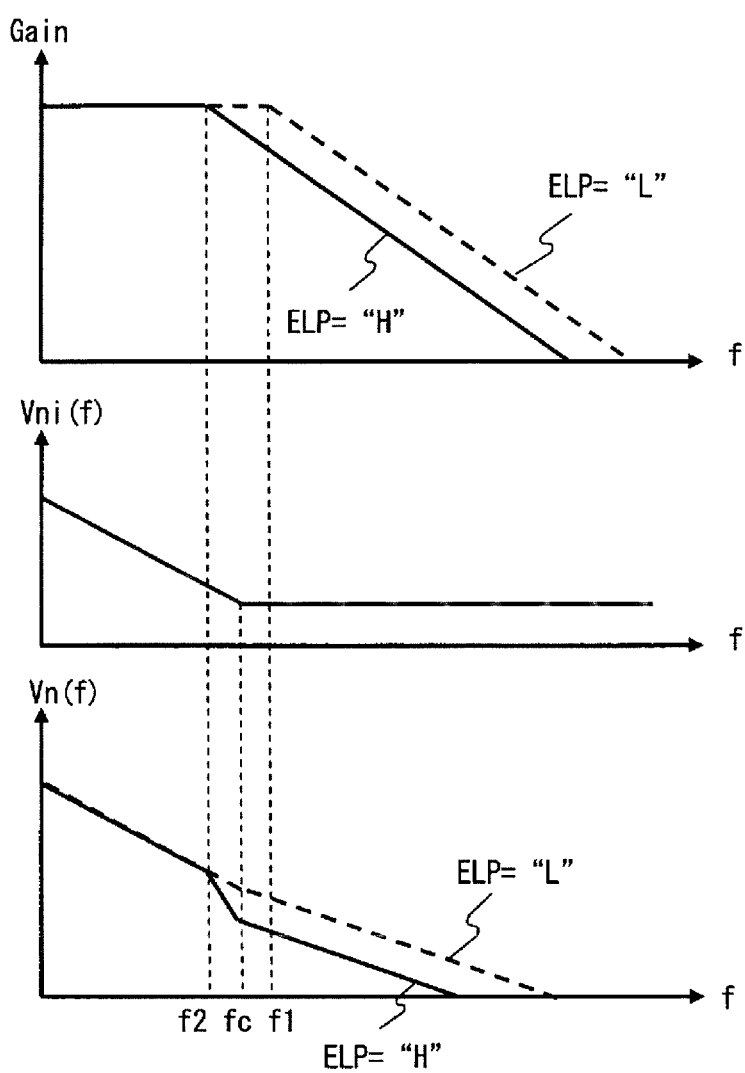
FIG. 8 is a graph showing examples of a gain and noise frequency characteristics of the differential amplifier of the magnetic sensor device of the present invention.

FIG. 8 is a graph showing examples of the gain and noise frequency characteristics of the differential amplifier 3. A low pass filter is controlled to be activated and inactivated based on a logic value of the ELP signal so that a cut-off frequency of a gain Gain of the differential amplifier 3 is set to f1 or f2. Moreover, in an input referred noise Vni(f) of the differential amplifier 3, flicker noise that is caused due to the MOS transistor and is inversely proportional to the frequency is dominant at a frequency lower than a corner frequency fc, whereas constant heat noise that is caused due to the MOS transistor and the resistive element and is independent of the frequency is dominant at a frequency higher than the corner frequency fc. The product of the input referred noise power spectrum Vni(f) and the above-mentioned gain Gain corresponds to an output noise power spectrum Vn(f) of the differential amplifier 3. Because the square root of the integral of the noise power spectrum Vn(f) from a direct current to a high frequency affects the determination operation of the comparator 4 as an effective noise voltage, it is understood that fluctuations in magnetic detection or release is more suppressed with the ELP signal being in the "H" state than with the ELP signal being in the "L" state.

Figure 9:
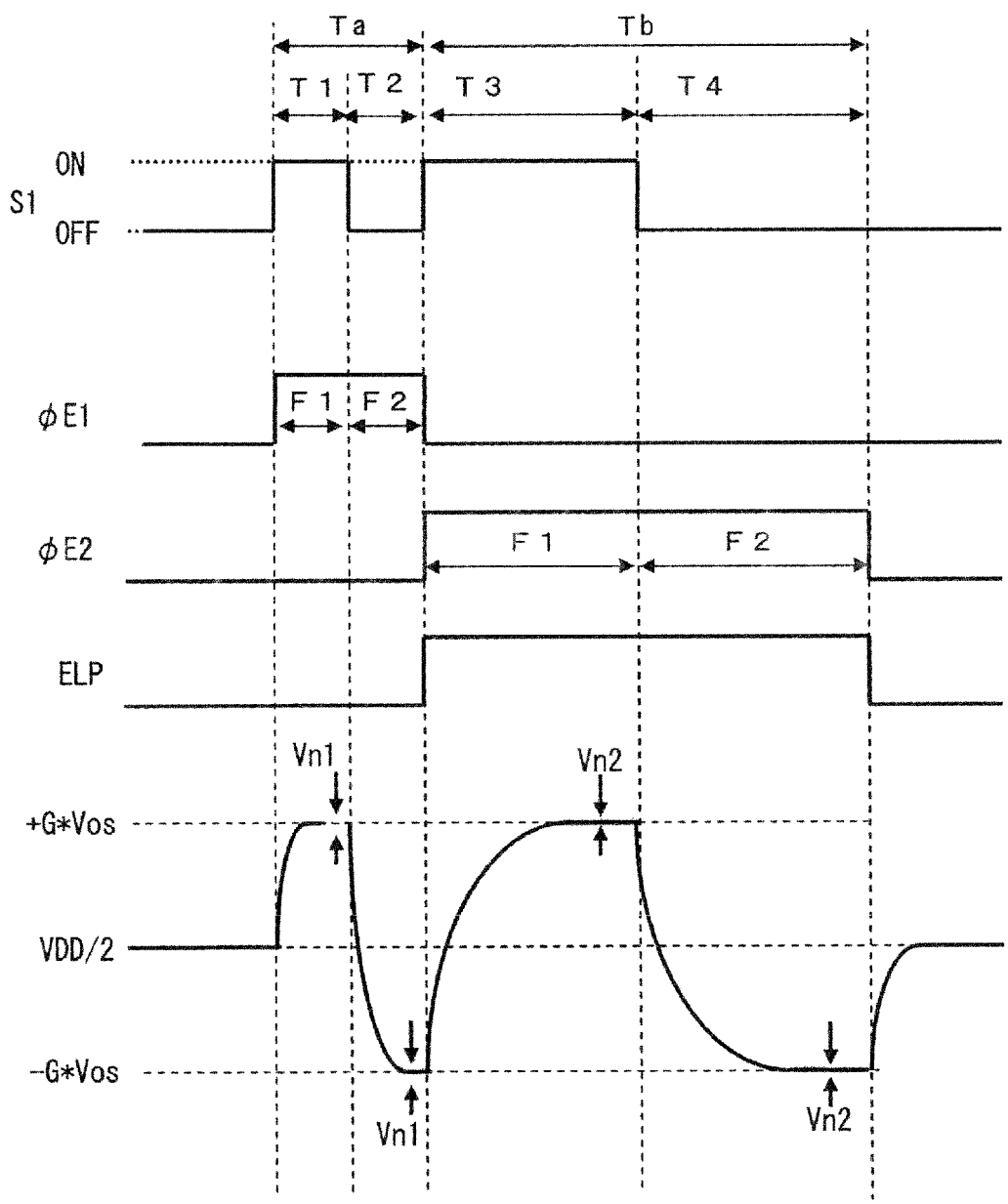
FIG. 9 is a chart illustrating transient response characteristics of the differential amplifier of the magnetic sensor device of the present invention.
Figure 10:
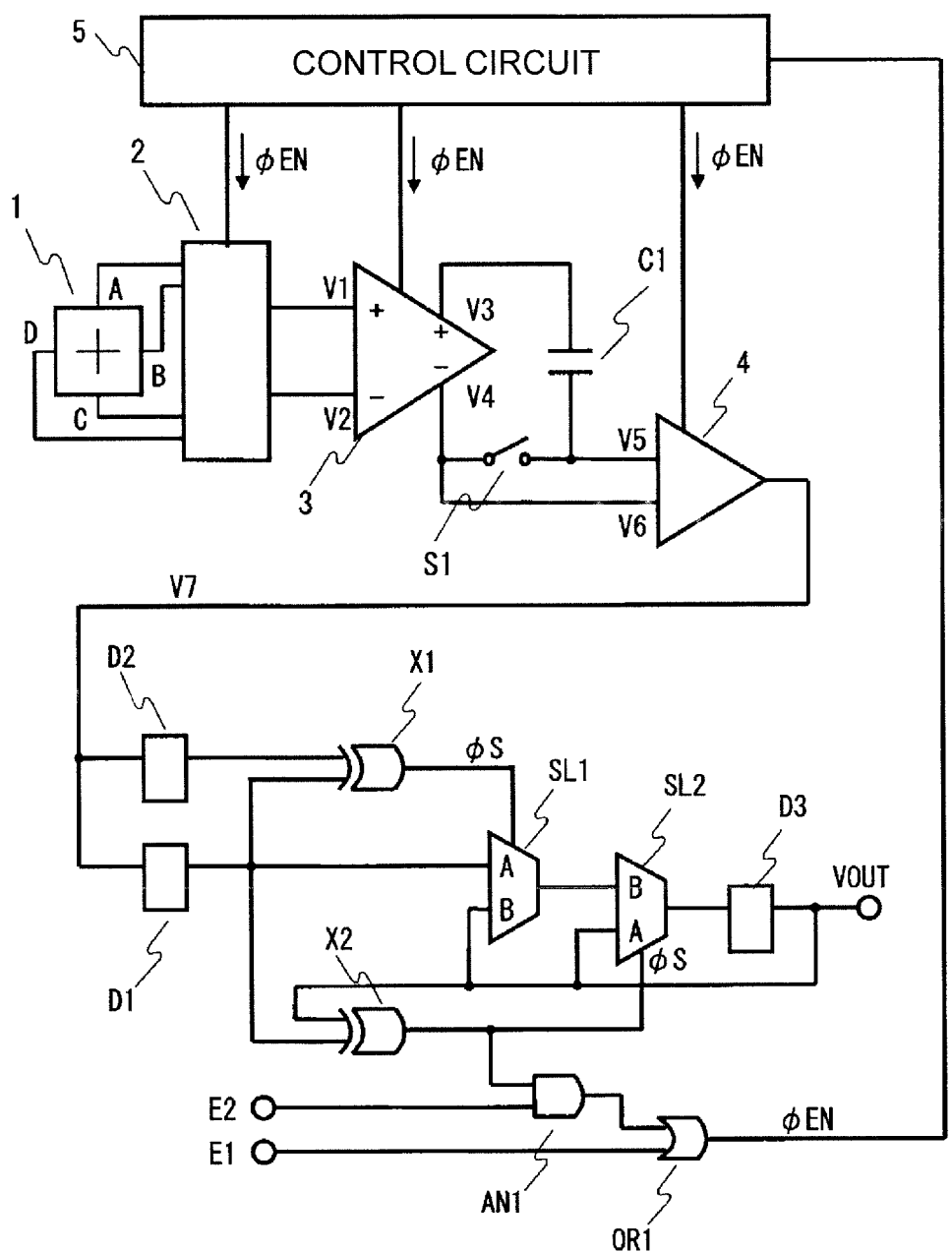
FIG. 10 is a circuit diagram illustrating a related-art magnetic sensor device.

FIG. 9 is a chart illustrating transient response characteristics of the differential amplifier of the magnetic sensor device of this embodiment. FIG. 9 illustrates a case where the determination on the first detection changes from the previous determination result.

When the ELP signal is in the "H" state (signal processing period Tb), a bandwidth of the differential amplifier 3 is narrow and a longer period is accordingly required for settling the output signal voltage V3 of the differential amplifier 3 than the case where the ELP signal is in the "L" state (signal processing period Ta). Control is performed to appropriately change the periods of the ON/OFF signals φE1 and φE2 so that Tb>Ta holds based on the logic of ELP signal. With this, appropriate settling time can be ensured even when the low pass filter is activated to reduce the bandwidth of the differential amplifier 3. Moreover, when the noise width of an output signal in the signal processing period Ta is represented by Vn1, and the noise width of an output signal in the signal processing period Tb is represented by Vn2, the relationship of Vn2<Vn1 holds as described above.

As described above, according to the magnetic sensor device of the present invention, it is possible to reduce fluctuations in determination on the detection of the magnetic field intensity or the release, which occur due to noise generated by the components in the device and noise from the outside, and to reduce the power consumption more than the related art. Therefore, it can be expected that a battery life of a mobile device is improved to be longer.

Second Embodiment

Figure 3:
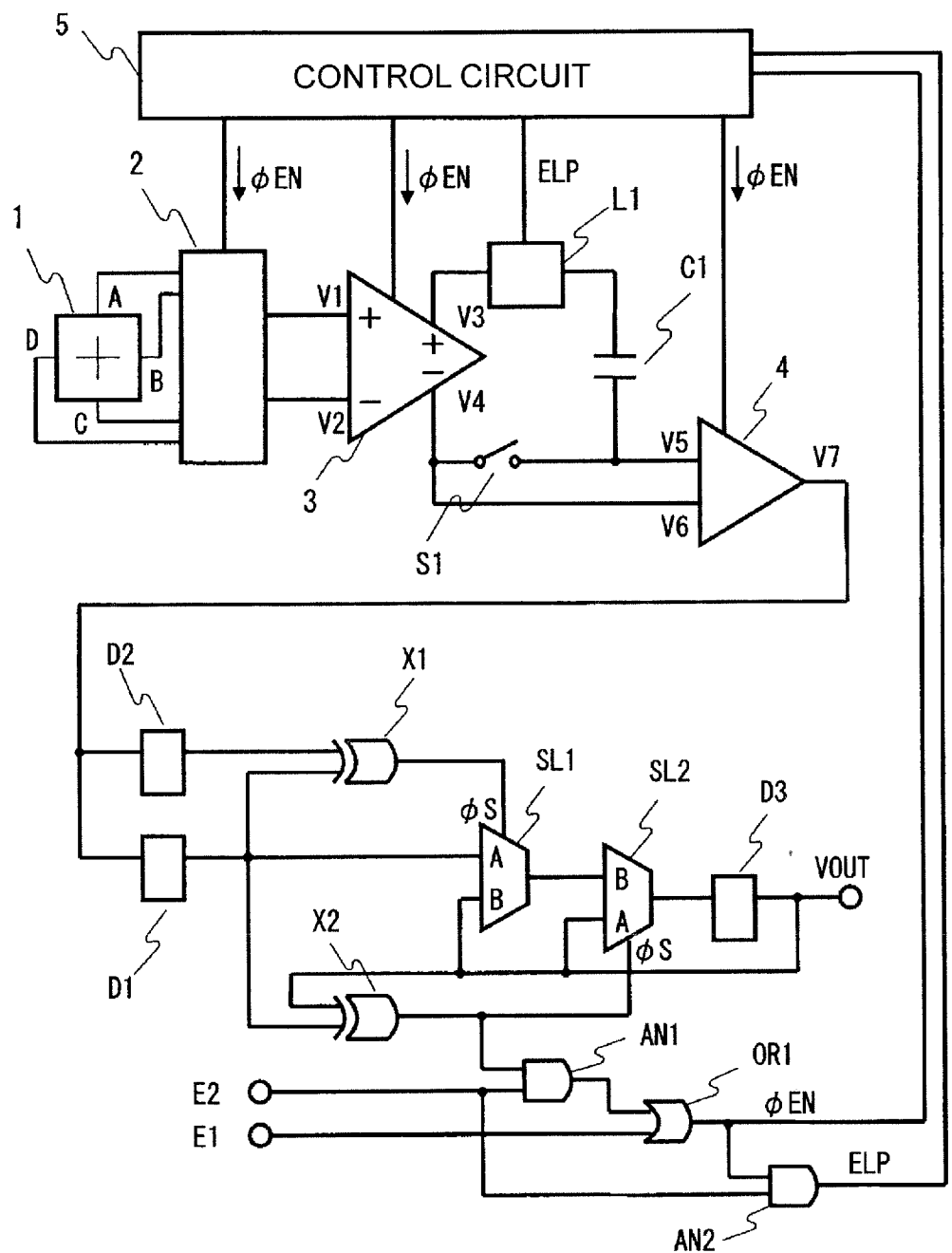
FIG. 3 is a circuit diagram illustrating a magnetic sensor device according to a second embodiment of the present invention.
Figure 6:
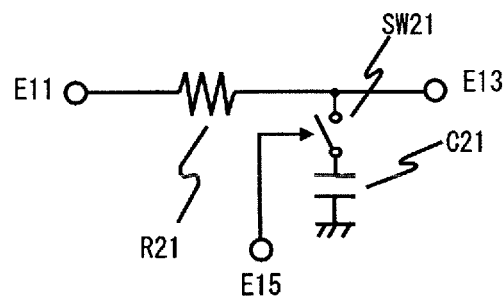
FIG. 6 is a circuit diagram illustrating an example of a low pass filter used in the second embodiment.

FIG. 3 is a circuit diagram illustrating a magnetic sensor device according to a second embodiment of the present invention. The second embodiment differs from the first embodiment in that a low pass filter circuit L1 is arranged between the first output terminal of the differential amplifier 3 and the capacitor C1. FIG. 6 is a circuit diagram illustrating an example of the low pass filter circuit L1 used in the second embodiment. The low pass filter circuit L1 has an input terminal E11, an output terminal E13, a control terminal E15, a resistive element R21 arranged between the input terminal E11 and the output terminal E13, a switching circuit SW21 connected to the output terminal E13, and a capacitive element C21 arranged between the switching circuit SW21 and a ground. The switching circuit SW21 is controlled to be turned on and off based on a logic voltage input to the control terminal E15. When the switching circuit SW21 is turned on, the capacitive element C21 is connected to the output terminal so that there is formed a low pass filter having a cut-off frequency in accordance with element values of the resistive element R21 and the capacitive element C21. When the switching circuit SW21 is turned off, the capacitive element C21 is cut off from the output terminal so that the low pass filter circuit L1 changes its characteristic to a low-pass characteristic having a cut-off frequency due to the resistive element R21 and parasitic capacitance across the output terminal E13 and the ground. In general, the cut-off frequency due to the parasitic capacitance is sufficiently high, and hence it is possible to neglect the influence on the frequency characteristics when the differential amplifier 3 takes the comparator 4 into account. In this manner, similarly to the first embodiment, the effective noise and the settling time can be controlled in response to the ELP signal. Other operations are the same as those in the first embodiment.

Third Embodiment

Figure 4:
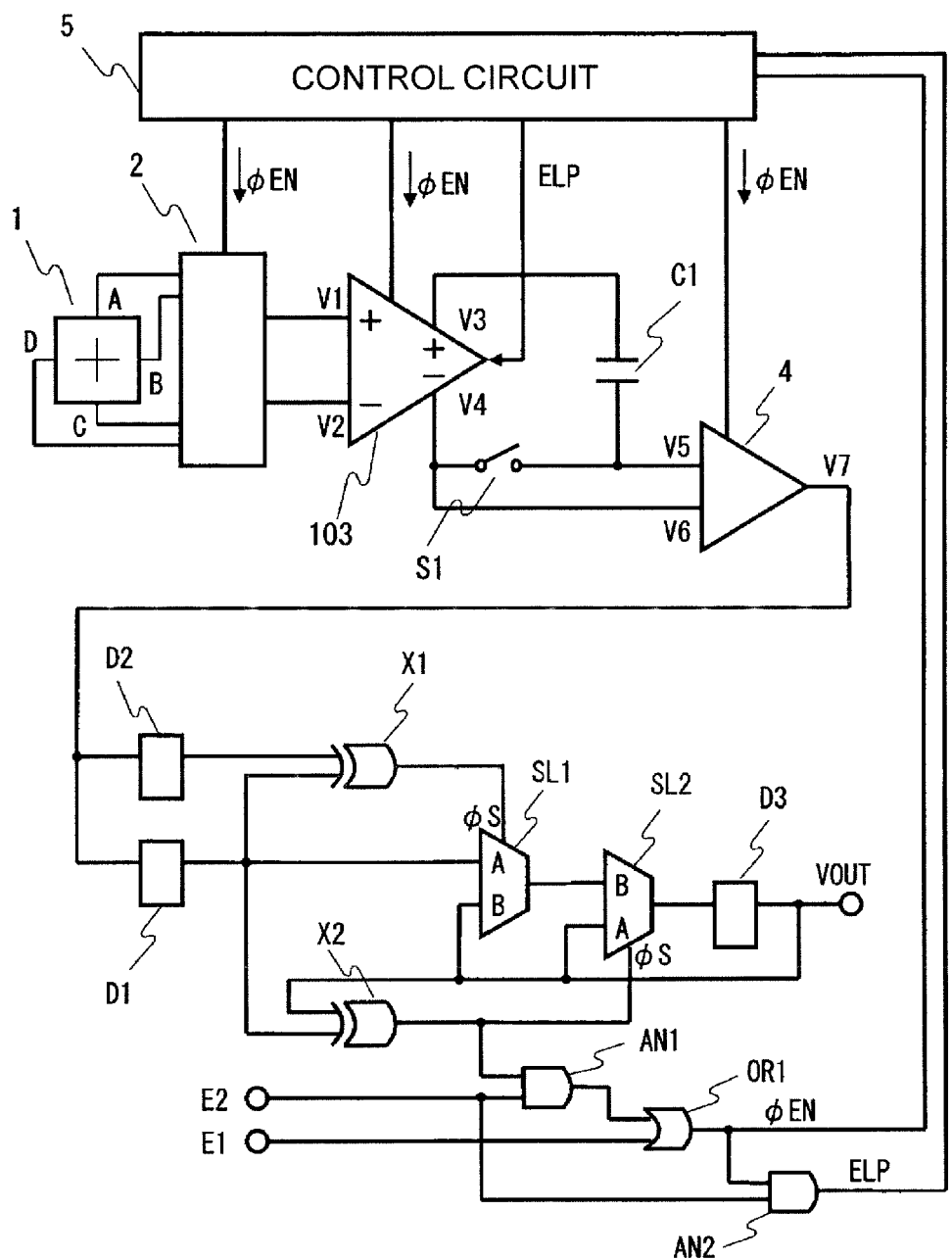
FIG. 4 is a circuit diagram illustrating a magnetic sensor device according to a third embodiment of the present invention.
Figure 7:
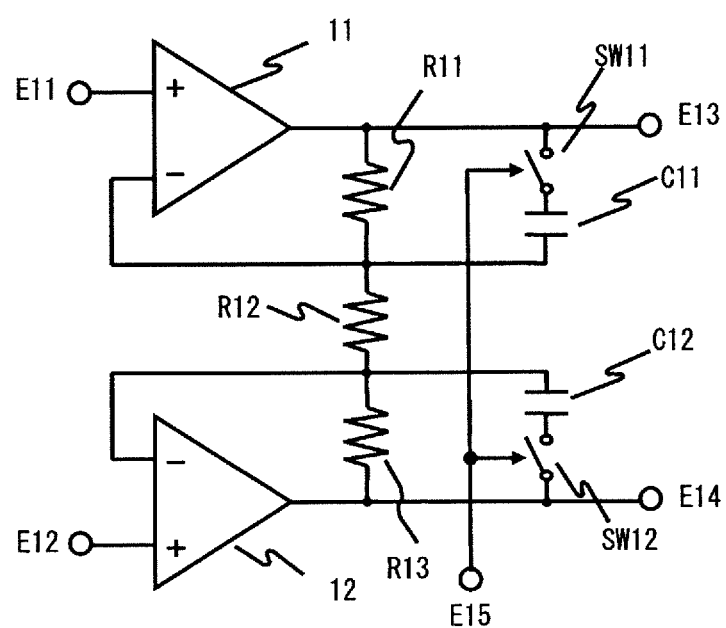
FIG. 7 is a circuit diagram illustrating an example of a differential amplifier used in the third embodiment.

FIG. 4 is a circuit diagram illustrating a magnetic sensor device according to a third embodiment of the present invention. The third embodiment differs from the first embodiment in that a capacitive element connected in parallel to a negative feedback resistor of a differential amplifier 103 is used for the low pass filter. FIG. 7 illustrates a configuration example of the differential amplifier 103 used in the third embodiment. The differential amplifier 103 has a positive input terminal E11, a negative input terminal E12, a positive output terminal E13, a negative output terminal E14, a control terminal E15, first and second operational amplifiers 11 and 12, first to third resistive elements R11 to R13, first and second capacitive elements C11 and C12, and first and second switching circuits SW11 and SW 12. A negative input terminal of the first operational amplifier 11 is connected to one terminal of the first resistive element R11, and an output terminal of the first operational amplifier 11 is connected to the other terminal of the first resistive element R11 and one terminal of the second resistive element R12. A negative input terminal of the second operational amplifier 12 is connected to one terminal of the third resistive element R13, and an output terminal of the second operational amplifier 12 is connected to the other terminal of the third resistive element R13 and the other terminal of the second resistive element R12. One terminal of the first switching circuit SW11 is connected to the positive output terminal E13, and one terminal of the second switching circuit SW12 is connected to the negative output terminal E14. The first capacitive element C11 is connected between the other terminal of the first switching circuit SW11 and the negative input terminal of the first operational amplifier 11, and the second capacitive element C12 is connected between the other terminal of the second switching circuit SW12 and the negative input terminal of the second operational amplifier 12. The first and second switching circuits are controlled to be turned on and off based on a logic voltage input to the control terminal E15. When the switching circuits SW11 and SW12 are turned on, the capacitive elements C11 and C12 are connected to the positive output terminal and the negative output terminal, respectively. Then, there is formed a low pass filter having a cut-off frequency in accordance with element values of the capacitive elements C11 and C12 and the resistive elements R11 and R13. When the switching circuits SW 11 and SW 12 are turned off, the capacitive elements C11 and C12 are cut off from the positive output terminal and the negative output terminal, respectively. Then, there is formed a low pass filter having a cut-off frequency in accordance with the product of the resistive elements R11 and R13 and parasitic capacitance values of the positive and negative output terminals. In general, the cut-off frequency due to the parasitic capacitance is sufficiently high, and hence it is possible to neglect the influence on the frequency characteristics when the differential amplifier 103 takes the comparator 4 into account. In this manner, similarly to the first embodiment, the effective noise and the settling time can be controlled in response to the ELP signal. Other operations are the same as those in the first embodiment.

Note that, in the first to third embodiments, the output terminal of the comparator 4 is connected to the two D type flip-flops, but the number of D type flip-flops may be three or more. In such a case, the previous detection result is stored unless all values of outputs of the D type flip-flops become the same. As the number of D type flip-flops connected in parallel to each other is more increased as described above, the influence of noise can be more suppressed. Moreover, other logic voltage storage circuits may be used instead of the D type flip-flop.

Moreover, the magnetic sensor device of the present invention uses only one low pass filter capacitive element. However, in the case where the number of D type flip-flops is increased to perform the verification three times or more as described above, two or more low pass filter capacitive elements are arranged so that the number of capacitive elements connected to a signal path by the switching circuit is increased in stages each time, for example, for the second, third, and fourth times the determination is made. In such a case, the magnetic determination accuracy is relatively improved each time the verification is performed, with the result that the magnetic determination can be made with high accuracy while the current consumption is more efficiently reduced.

Moreover, the magnetic sensor device of the present invention changes the signal periods of the signals φEN, φE1, and φE2 based on the first latch result. However, a reference CLK frequency of an oscillator configured to generate a reference CLK signal for generating those control signals may be changed, or a frequency of an output signal of the oscillator may be divided in a frequency divider circuit to generate the reference CLK signal, and the division ratio may be changed. In the former case, the circuit configuration is complicated but the change ratio can be arbitrarily set. On the other hand, in the latter case, the circuit configuration is simple but the change ratio is limited to a multiple of (2^n).

Moreover, the magnetic sensor device of the present invention, which includes the circuits from the Hall element 1 to the comparator 4 configured as illustrated in FIG. 1, FIG. 3, and FIG. 4, is described. However, the present invention is not limited to those circuit configurations. For example, a configuration may be employed in which an arbitrary voltage output from a separately arranged reference voltage circuit is used as a reference voltage to be compared in the comparator 4. Moreover, the reference voltage output from the reference voltage circuit may be switched in accordance with the detection/release state to provide hysteresis.

Moreover, the magnetic sensor device of the present invention, which includes the magnetoelectric conversion element being the Hall element, is described, but other kinds of magnetoelectric conversion elements such as a GMR element and a TMR element may be used.

Moreover, the magnetic sensor device of the present invention uses, as an example of the selector circuit, the configuration using a transmission gate. However, a switching circuit only using an N-type transistor or a switching circuit only using a P-type transistor may be used depending on operation power supply voltage use and a process parameter.

In addition, the magnetic sensor device of the present invention can be used for bipolar detection (for example, rotation number detection for a motor) use. The bipolar detection is performed by a magnetic sensor device that changes its state from a state of detecting only one pole (for example, S-pole) to a state of detecting only the other pole (N-pole) after the one pole is detected.

What is claimed is:

1. A sensor device, comprising:
   a physical quantity voltage conversion element configured to output a differential voltage in accordance with a magnitude of a physical quantity;
   a differential amplifier configured to amplify an output signal of the physical quantity voltage conversion element;
   a first capacitor that includes one terminal connected to a first output terminal of the differential amplifier, and is configured to store an offset voltage;
   a comparator configured to input a signal obtained by amplifying the output signal of the physical quantity voltage conversion element, and to output a result of comparison;
   a low pass filter circuit arranged at the first output terminal of the differential amplifier;
   a control circuit configured to on/off control the physical quantity voltage conversion element, the differential amplifier, the comparator, and the low pass filter circuit; and
   a logic circuit configured to output a result of operation processing performed on an output signal of the comparator as a logic output,
   the logic circuit being configured to:
   successively verify, in a case where there is a change between a previous logic output and a first logic output, the logic outputs a plurality of times; and
   output a control signal to the control circuit so that the low pass filter circuit is turned on in a second signal processing period and thereafter.

2. A sensor device according to claim 1, wherein the low pass filter circuit comprises:
   a switching circuit; and
   a second capacitor connected in parallel to the first capacitor.

3. A sensor device according to claim 1, wherein the low pass filter circuit comprises:
   a resistive element connected between the first output terminal of the differential amplifier and one end of the first capacitor; and
   a switching circuit and a second capacitor connected in series between the one end of the first capacitor and a ground terminal.

4. A sensor device according to claim 1, wherein the physical quantity voltage conversion element comprises a magnetoelectric conversion element configured to output a differential voltage in accordance with a magnitude of magnetic field intensity.

* * * * *